(12) United States Patent
Tsukagoshi et al.

(10) Patent No.: US 9,362,195 B2
(45) Date of Patent: Jun. 7, 2016

(54) SEMICONDUCTOR DEVICE (71) Applicant: SEIKO INSTRUMENTS INC., Chiba-shi, Chiba (JP)

(72) Inventors: Koji Tsukagoshi, Chiba (JP); Sadao Oku, Chiba (JP); Hiroyuki Fujita, Chiba (JP); Keiichiro Hayashi, Chiba (JP); Masaru Akino, Chiba (JP)

(73) Assignee: SII SEMICONDUCTOR CORPORATION (JP)

( * ) Notice: Subject to any disclaimer, the term of this patent is extended or adjusted under 35 U.S.C. 154(b) by 66 days.

(21) Appl. No.: 14/319,414

(22) Filed: Jun. 30, 2014

(65) Prior Publication Data

US 2015/0008568 A1 Jan. 8, 2015

(30) Foreign Application Priority Data

Jul. 2, 2013 (JP) ................................. 2013-139144

(51) Int. Cl.
*H01L 23/495* (2006.01)
*H01L 23/31* (2006.01)
*H01L 23/498* (2006.01)
*H01L 23/24* (2006.01)

(52) U.S. Cl.
CPC ............ *H01L 23/3114* (2013.01); *H01L 23/24* (2013.01); *H01L 23/49861* (2013.01); *H01L 23/49551* (2013.01); *H01L 2224/32225* (2013.01); *H01L 2224/32245* (2013.01); *H01L 2224/48091* (2013.01); *H01L 2224/48247* (2013.01); *H01L 2224/73265* (2013.01)

(58) Field of Classification Search
USPC ........................................................ 257/676
See application file for complete search history.

(56) References Cited

U.S. PATENT DOCUMENTS

| 6,339,191 | B1 * | 1/2002 | Crane et al. .................... 174/551 |
| 6,448,633 | B1 * | 9/2002 | Yee et al. ....................... 257/666 |
| 7,495,320 | B2 * | 2/2009 | Cusack .......................... 257/666 |
| 8,008,758 | B1 * | 8/2011 | Kim et al. ...................... 257/676 |
| 8,193,619 | B2 * | 6/2012 | Kim et al. ...................... 257/670 |
| 2005/0236639 | A1 * | 10/2005 | Abe et al. ....................... 257/100 |
| 2007/0252245 | A1 * | 11/2007 | Cusack .......................... 257/666 |
| 2008/0036055 | A1 * | 2/2008 | Yee et al. ....................... 257/667 |
| 2010/0237478 | A1 * | 9/2010 | Kim et al. ...................... 257/670 |
| 2011/0018026 | A1 * | 1/2011 | Konno et al. ................... 257/100 |
| 2011/0291253 | A1 * | 12/2011 | Fukuda et al. ................. 257/676 |

FOREIGN PATENT DOCUMENTS

JP  08008384 A  * 1/1996  .............. H01L 23/50

OTHER PUBLICATIONS

Patent Abstracts of Japan, Publication No. 2002-280616, Publication Date Sep. 27, 2002.

* cited by examiner

*Primary Examiner* — Telly Green
(74) *Attorney, Agent, or Firm* — Adams & Wilks (57) ABSTRACT

Provided is a semiconductor device including a package having a hollow portion, which can meet the need of reduction in size and thickness. The semiconductor device includes: a resin molded member (1) including a hollow portion (10) having an inner bottom surface on which a semiconductor chip (6) is mounted, a surrounding portion (1*b*) that surrounds the hollow portion (10), and a bottom surface portion (1*a*); an inner lead (2*e*, 2*f*); and an outer lead (2*a*, 2*b*) exposed from the resin molded member (1). The inner lead buried in the molded member (1) includes an L-shaped lead extending portion having a through hole formed therethrough.

7 Claims, 6 Drawing Sheets

SEMICONDUCTOR DEVICE

BACKGROUND OF THE INVENTION

1. Field of the Invention

The present invention relates to a semiconductor device, in particular, to a package structure of a packaged semiconductor device.

2. Description of the Related Art

In recent years, remarkable spread and expansion of mobile personal computers, tablet personal computers, smartphones, and the like gives an expectation of expansion of a large variety of electronic components to be mounted on those devices. Many of those devices have a feature of combining light weight, small thickness, and compactness by preference to sophisticated and portable designs. Resin mold packages have been thus often used, since the electronic components to be mounted have also been demanded to reduce their size, thickness, and cost. Along with the trend of a shorter product replacement cycle, the package to be mounted has been simultaneously demanded to reduce its size, thickness, and cost. As a result, negative effects have appeared, such as insufficiency in reliability of the product and weakness and low strength of the package. This is because the reduction in size and thickness has been often achieved by shrinking the product without changing or re-examining conventional factors such as a material, a raw material, and a structure. It can be said that changes in encapsulation resin thickness, lead frame thickness, and package substrate thickness, which have been thinned and reduced by the shrinking, are not compensated for. In addition, reduction in cost leads to an effect on difficulty in securing sufficient reliability. Thus, it is necessary to review again the structure and design that can improve the reliability of the electronic components that are reducing in size and thickness. Specifically for the resin mold packages that have been put into production in many semiconductor packages, it is important to realize constant reliability along with the promotion of reduction in thickness and size of the constructing material and the frame, and various approaches are becoming more important for development of semiconductor packages.

Figure 10:
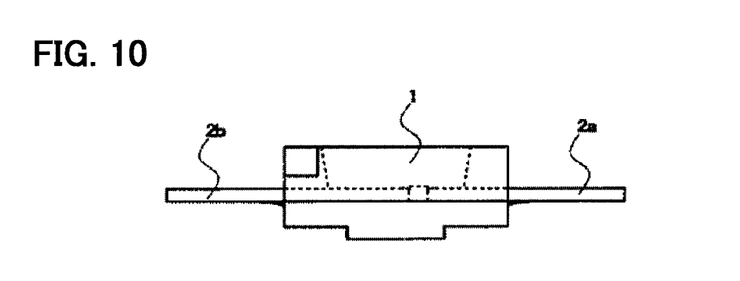
FIG. 10 is a sectional view illustrating a related-art semiconductor device.

FIG. 10 is a sectional view of a package including a resin having a hollow portion and lead frames (FIG. 3 of Japanese Patent Application Laid-open No. 2002-280616). The package includes a resin molded portion 1 and lead frames 2a and 2b, and the lead frames 2a and 2b are retained by the resin molded portion 1. In the hollow portion, one end of the surface of each of the lead frames 2a and 2b is exposed. Another end of each of the lead frames 2a and 2b is exposed outside through the resin molded portion to function as an external terminal. The lead frames 2a and 2b are used in such a manner that an element is mounted onto the lead frame 2b exposed to the hollow portion. The element is fixed onto the lead frame 2b by conductive paste and the like. An electrode provided on the upper surface of the element and the lead frame 2a or 2b exposed to the hollow portion are electrically connected to each other by a wire for use. Examples of the element to be mounted include a photosensor element. In this case, an electromotive force generated by light entering the photosensor element is transmitted from the wire connecting together the upper surface of the photosensor element and the lead frame 2a or 2b to the lead frame to flow to the outside.

However, in the package structure described in Japanese Patent Application Laid-open No. 2002-280616, the lead frames 2a and 2b are retained only by the resin used in the resin molded portion, and hence the retaining force for the lead frames significantly depends on the resin performance. In particular, the structure having the hollow portion has a smaller resin area for retaining the lead frames as compared to the resin encapsulation structure package having no hollow portion. The lead frames 2a and 2b function as external terminals, and hence the terminals are used in a shape obtained through bending and cutting based on a desired embodiment or dimension.

It is known that bending and cutting apply a force most to the root between the resin molded portion and the lead frame, and the lead frame retaining force of the resin is an important factor such as when a force acts in a pulling direction or when a force acts on a twisting direction. During such processing, when the retaining force for the lead frames is weak, the lead frame may dropout from the resin molded portion, or the reduction in retaining force may cause reduction in bending accuracy. Further, the packages are diversifying, and many packages use a lead frame that is thin and fine, as represented by a small-type package, a thin-type package, a multi-pin package, and the like. As the area of the lead frame to be brought into close contact with the resin reduces, the retaining force thereof is further reduced.

Further, the package has a structure having the hollow portion. In the molded portion formed of the resin, a hollow part is a part having the smallest thickness of the resin. Thus, it can be said that the heat resistance and strength against an external force applied to the package are determined based on the resin performance and thickness. As reduction in size and thickness of the package dimension is promoted, the resin thickness of the hollow part is inevitably reduced, and it is difficult to maintain a sufficient strength with the thinned hollow part. As a result, deformation, cracking, and the like are caused due to the insufficiency in strength of the hollow part, which reduces the reliability of the package.

Further, because the hollow part is thinned due to reduction in size and thickness of the package, the above-mentioned lead frame retaining area of the resin is further reduced, which leads to reduction in reliability of the package. As measures against strength reduction and deformation caused by reduction in thickness of the resin, a reinforcement material such as inorganic filler is mixed into the resin. However, mixing filler or the like into the resin causes influences such as, due to reduction in flowability of the resin, reduction in stability during molding, reduction in molding processing speed, and weakness of the molded resin. Thus, the reinforcement of resin by mixing filler is limited.

SUMMARY OF THE INVENTION

The present invention has been made in view of the above-mentioned problems, and has an object to provide a semiconductor device having a package structure with a hollow portion, which is highly reliable and capable of increasing a retaining force between a lead frame and a resin while downsizing the package.

In order to solve the above-mentioned problems, the following measure is used.

First, a semiconductor device according to one embodiment of the present invention includes: a semiconductor chip; a resin molded member including: a hollow portion having an inner bottom surface on which the semiconductor chip is mounted; a surrounding portion formed so as to surround the hollow portion; and a bottom surface portion formed below the surrounding portion and the hollow portion; an inner lead having a region exposed to the hollow portion and a region buried in the resin molded member; and an outer lead that is continuous to the inner lead and is exposed from the resin molded member, in which the inner lead that is buried in the resin molded member includes an L-shaped lead extending portion having a through hole formed therethrough.

Further, in the semiconductor device, the L-shaped lead extending portion includes a horizontal portion, a bent portion, and a perpendicular portion.

Further, in the semiconductor device, the through hole is formed continuously through the horizontal portion, the bent portion, and the perpendicular portion of the L-shaped lead extending portion.

Further, in the semiconductor device, the through hole includes a plurality of holes, and all of the plurality of holes are formed continuously through the horizontal portion, the bent portion, and the perpendicular portion of the L-shaped lead extending portion.

Further, in the semiconductor device, the through hole has a peripheral edge including a protrusion.

Further, in the semiconductor device, the semiconductor chip is fixed onto an island that is buried in the bottom surface portion of the resin molded member in such a manner that a surface of the island is exposed.

Further, in the semiconductor device, the island has an exposed back surface that is opposite to a surface on which the semiconductor chip is placed.

By using the above-mentioned measure, even in the semiconductor device having a resin molded package that includes a hollow portion and a lead frame, a highly reliable package that is strong against impact from the outside can be obtained, and hence the semiconductor device can meet the need of reduction in size and thickness.

In the semiconductor device that uses the resin molded package including the hollow portion and the lead frame, the strength of the resin molded portion for retaining the lead frame is increased, and thus a lead-frame unmating force increases. Thus, even when the package is reduced in size and thickness, it is possible to prevent dropping out of the frame and reduction in processing accuracy when the lead frame to be used as an external terminal is subjected to bending or cutting. Further, the hollow part whose strength is reduced by being thinned in the package reduced in size and thickness can be reinforced and further protected against an impact that the package receives from the outside. Thus, effects of protection of the semiconductor chip to be mounted, prevention of cracking and chipping of the resin, and suppression of deformation of the package can be obtained. Further, the frame bent by 90° is arranged inside the resin molded portion. With this structure, the flame is not excessively projected, which can contribute to a design that enable downsizing of the package. In addition, there is also such an effect that, when moisture enters the package from the outside, a bent part of the frame in the resin molded portion temporarily accumulates the moisture to delay the entrance. Thus, it is possible to provide a highly reliable semiconductor device by using a package that can reduce an effect on moisture entrance.

DETAILED DESCRIPTION OF THE PREFERRED EMBODIMENTS

Figure 1:
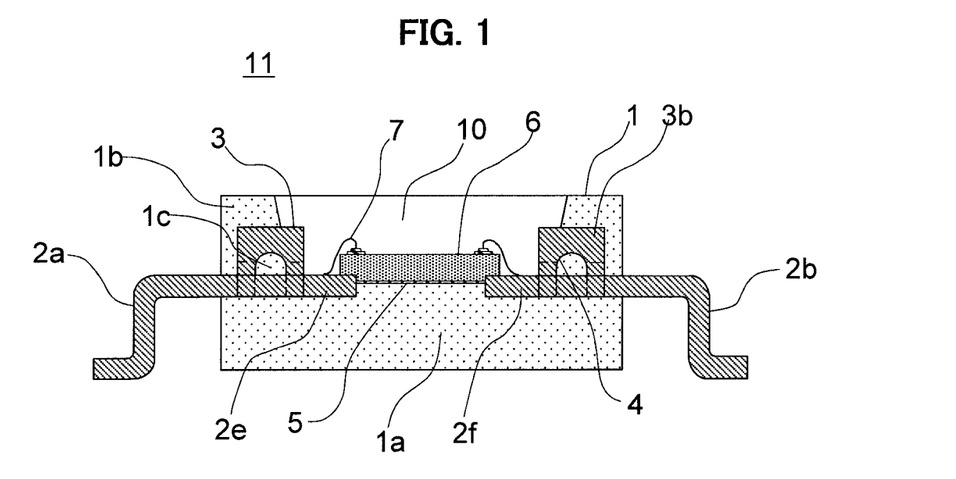
FIG. 1 is a sectional view illustrating a semiconductor device according to a first embodiment of the present invention.

FIG. 1 is a sectional view illustrating a semiconductor device 11 according to a first embodiment of the present invention.

A resin molded member 1 having a hollow portion 10 includes a surrounding portion 1b having an inclined wall surface that is formed so as to surround the hollow portion 10, and a bottom surface portion 1a formed below the surrounding portion 1b and the hollow portion 10. The resin molded member is molded with use of a thermoplastic or thermosetting resin. Further, the resin molded member contains filler or the like.

On the bottom surface portion 1a that is an inner bottom surface of the hollow portion 10, a semiconductor chip 6 is placed through an adhesive 5. Electrodes on the surface of the semiconductor chip 6 are electrically connected through wires 7 to respective inner leads 2e and 2f exposed to the hollow portion 10. Each of the inner leads 2e and 2f has an upper part exposed to the hollow portion 10, and a lower part buried in the bottom surface portion 1a. Thus, the inner lead does not come off from the bottom surface portion due to impact at the time of wire bonding, and poor bonding is prevented. In FIG. 1, the upper half of the inner lead is exposed to the hollow portion 10, but only the surface of the inner lead may be exposed and the remaining part may be buried in the bottom surface portion. Further, there is no problem in wire bonding even when only a region for bonding is exposed and the remaining inner lead surface is buried in the bottom surface portion. The inner leads 2e and 2f pass through the resin molded member to become outer leads 2a and 2b that are exposed to the outside of the resin molded member 1. Note that, the resin molded member 1 and the inner leads 2e and 2f are in a close-contact state. In a region of each of the inner leads 2e and 2f that is brought into contact with the surrounding portion 1b, a lead extending portion 3 is provided, which is extended from the inner lead in a deep-side direction of the drawing sheet. A perpendicular portion 3b that perpendicularly rises in the direction of the surrounding portion on the opposite side to the bottom surface portion 1a of the resin molded member 1 is a part of the lead extending portion 3, and has a structure of reinforcing the surrounding portion. Further, a semicircular through hole 4 is provided in the perpendicular portion 3b, and the through hole 4 filled with a resin 1c, which provides an effect of improving the close-contact performance between the inner lead and the resin molded member.

Figure 2:
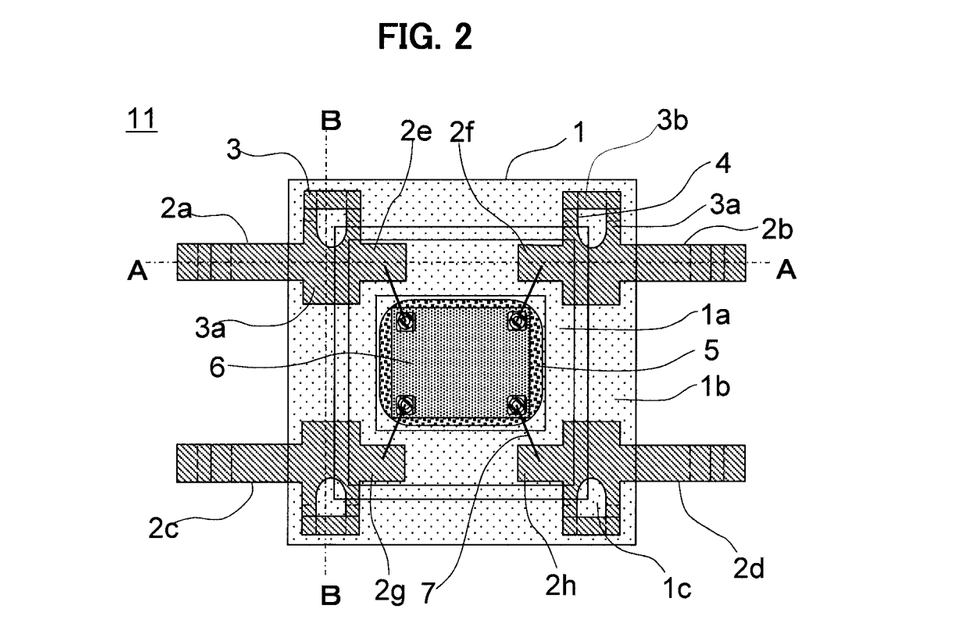
FIG. 2 is a plan view illustrating the semiconductor device according to the first embodiment of the present invention.

FIG. 2 is a plan view illustrating the semiconductor device according to the first embodiment of the present invention.

FIG. 2 is a view as viewed from the top of the semiconductor device illustrated in FIG. 1. The rectangular resin molded member 1 has the surrounding portion 1b at the periphery, and the rectangular bottom surface portion 1a is exposed therein. The semiconductor chip 6 is fixed through the adhesive 5 in the vicinity of the center of the bottom surface portion 1a, and the electrodes formed at the four corners of the rectangular semiconductor chip 6 are connected to respective inner leads 2e, 2f, 2g, and 2h through the wires 7. The inner leads 2e, 2f, 2g, and 2h pass through the resin molded member 1 to become outer leads 2a, 2b, 2c, and 2d that are exposed to the outside of the resin molded member 1. Each of the inner leads 2e, 2f, 2g, and 2h includes the cross-shaped lead extending portion 3 formed by partially increasing the thickness of the inner lead. The lead extending portion 3 is provided to have different sizes on both side surfaces of the inner lead, and the L-shaped lead extending portion 3 is formed on one side surface. In FIG. 2, the through hole 4 provided in a horizontal portion 3a is filled with the resin 1c. In this manner, the close-contact performance between the inner lead and the resin existing on the upper and lower sides of the through hole 4 is increased, to thereby firmly fix the inner lead to the resin molded member. At the end of the horizontal portion 3a, the perpendicular portion 3b that perpendicularly rises is formed in a state of being completely buried in the surrounding portion 1b. Although not illustrated, the through hole 4 is also provided in the perpendicular portion 3b. Further, the lead extending portion 3 is provided also in the other side surface of the inner lead, but at this place, only the horizontal portion 3a that is buried in the bottom surface portion 1a and arranged in the horizontal direction is formed.

Figure 3:
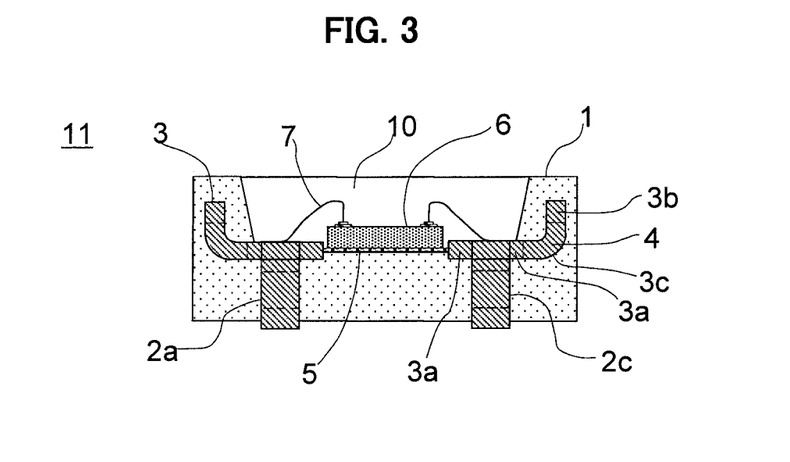
FIG. 3 is a sectional view taken along the line B-B of FIG. 2.

In FIG. 2, the line A-A and the line B-B are illustrated. FIG. 1 is a sectional view taken along the line A-A, and FIG. 3 is a sectional view taken along the line B-B. However, those sectional views are not a complete section, and additionally illustrate components existing on the deep side and the front side of the section. For example, the perpendicular portion 3b and the through hole 4 in FIG. 1 are components that are observed in the deep-side direction with respect to the A-A section, but are additionally illustrated so as to enhance the understanding. Thus, FIG. 1 can be said to be a front view in which the resin molded member is illustrated transparent.

As described above, FIG. 3 is a sectional view taken along the line B-B of FIG. 2. Similarly to FIG. 1, FIG. 3 can be said to be a side view in which the resin molded member is illustrated transparent.

It is understood that the lead extending portion 3 has a bent shape that bends from the linear horizontal portion 3a toward the perpendicular portion 3b. A bent portion 3c has an arc shape in section, and the curvature radius of the inner diameter thereof is equal to or more than half the thickness of the lead extending portion 3. Thus, the curvature radius of the outer diameter thereof is equal to or more than 1.5 times the thickness of the lead extending portion 3. With such a bending shape, the bent portion 3c is less distorted, and the mechanical strength of the surrounding portion is improved.

In this case, the through hole 4 is formed continuously from the horizontal portion 3a via the arc-shaped bent portion 3c to the perpendicular portion 3b. With this, the structure is strong against stresses in various directions such as an oblique direction in addition to the horizontal direction and the perpendicular direction. Note that, the outer leads 2a and 2c illustrated in FIG. 3 are observed in the front-side direction of the drawing sheet with respect to the B-B section.

In FIGS. 1 to 3, the upper side of the hollow portion surrounded by the surrounding portion is opened, but in order to improve the reliability as the semiconductor device, a lid may be provided on the upper surface of the hollow portion, or the hollow portion may be encapsulated by a resin.

The semiconductor device of the present invention described above includes the L-shaped lead extending portion that is buried in the resin molded member and has the through hole, and hence the thin surrounding portion can be reinforced, and a structure strong against stresses from various directions can be achieved. Further, regarding the dropping out of the inner lead, the structure has a high lead-removal preventing performance. With the above-mentioned effects, the semiconductor device can be more reduced in size and thickness. Further, when moisture enters the semiconductor device from a gap between the resin molded portion and the lead frame exposed to the outside, a part of the lead frame that is bent by 90° plays a role to temporarily accumulate the entering moisture in the resin molded portion, an hence there is an effect of delaying the arrival of the moisture into the hollow portion to reduce moisture entrance.

Figure 4:
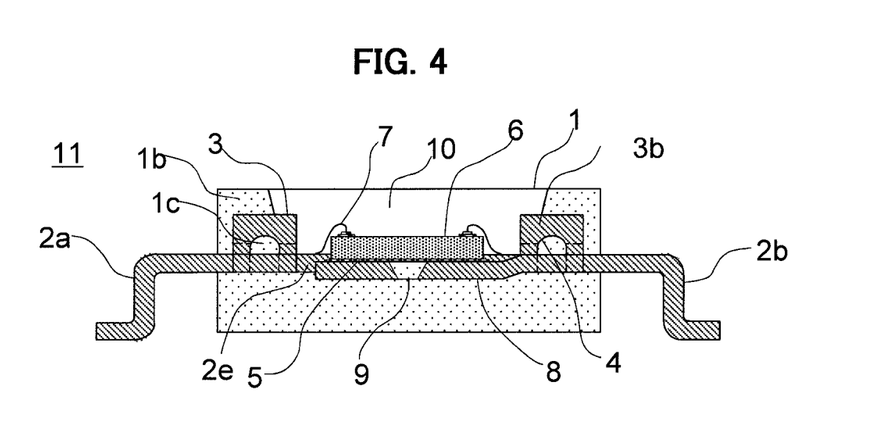
FIG. 4 is a sectional view illustrating a semiconductor device according to a second embodiment of the present invention.

FIG. 4 is a sectional view illustrating a semiconductor device according to a second embodiment of the present invention.

The second embodiment differs from the first embodiment in that a die pad is provided between the semiconductor chip 6 and the bottom surface portion 1a. A die pad 8 is formed on the bottom surface portion 1a of the resin molded member so as to be buried in such a manner that its surface is exposed. The semiconductor chip 6 is fixed to the surface of the die pad 8 through the adhesive 5. A die pad through hole 9 is provided in the vicinity of the center of the die pad 8, and the hole is filled with a resin so that the die pad 8 is firmly fixed to the bottom surface portion 1a.

Figure 5:
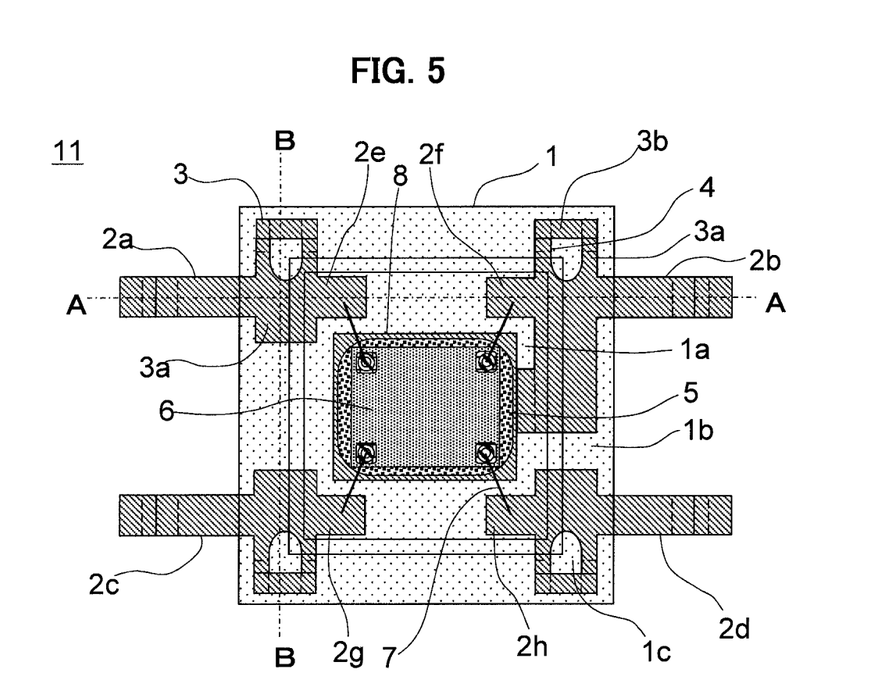
FIG. 5 is a plan view illustrating the semiconductor device according to the second embodiment of the present invention.

FIG. 5 is a plan view illustrating the semiconductor device according to the second embodiment of the present invention.

FIG. 5 is a view as viewed from the top of the semiconductor device illustrated in FIG. 4. In this embodiment, the die pad 8 is connected to the inner lead 2f through a suspension lead, and hence heat generated by the semiconductor chip 6 can be released to the outside through the inner lead.

Figure 6:
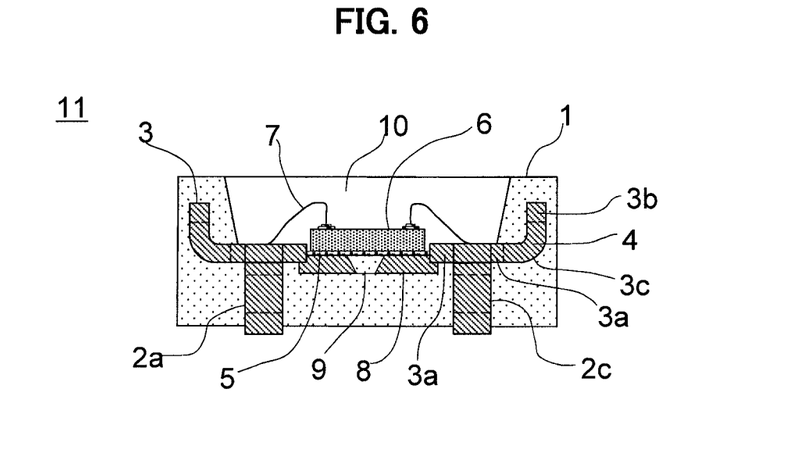
FIG. 6 is a sectional view taken along the line B-B of FIG. 5.

FIG. 6 is a sectional view taken along the line B-B of FIG. 5.

It is understood that the lead extending portion 3 has a bent shape that bends from the horizontal portion 3a toward the perpendicular portion 3b. In this case, the through hole 4 is formed continuously from the horizontal portion 3a via the arc-shaped bent portion 3c to the perpendicular portion 3b. With this, the structure is strong against stresses in various directions such as an oblique direction in addition to the horizontal direction and the perpendicular direction. Note that, the outer leads 2a and 2c illustrated in FIG. 6 are observed in the front-side direction of the drawing sheet with respect to the B-B section.

In FIGS. 4 to 6, the upper side of the hollow portion surrounded by the surrounding portion is opened, but in order to improve the reliability as the semiconductor device, a lid may be provided on the upper surface of the hollow portion, or the hollow portion may be encapsulated by a resin.

The semiconductor device of the present invention described above includes the L-shaped lead extending portion that is buried in the resin molded member and has the through hole, and hence the thin surrounding portion can be reinforced, and a structure strong against stresses from various directions can be achieved. Further, regarding the dropping out of the inner lead, the structure has a high lead-removal preventing performance. With the above-mentioned effects, the semiconductor device can be more reduced in size and thickness. Further, when moisture enters the semiconductor device from a gap between the resin molded portion and the lead frame exposed to the outside, a part of the lead frame bent by 90° plays a role to temporarily accumulate the entering moisture in the resin molded portion, and hence there is an effect of delaying the arrival of the moisture into the hollow portion to reduce moisture entrance. Further, the die pad is connected to the lead, and hence the package can also be used as a high heat-releasing package.

Figure 7:
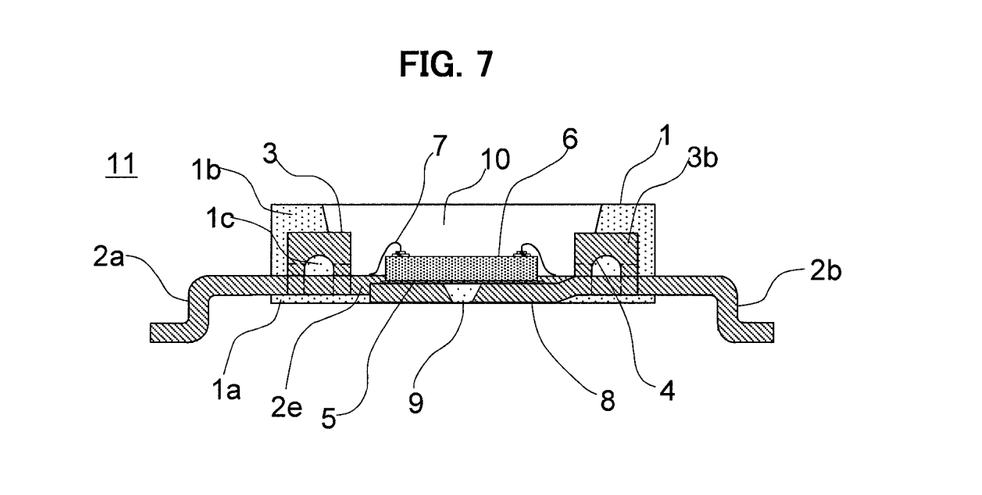
FIG. 7 is a sectional view illustrating a semiconductor device according to a third embodiment of the present invention.

FIG. 7 is a sectional view illustrating a semiconductor device according to a third embodiment of the present invention.

The third embodiment differs from the second embodiment in that the bottom surface portion 1a of the resin molded member is thinned to expose the back surface of the die pad 8. With such a configuration, the highly heat-conductive die pad 8 made of copper or the like can be directly bonded to other components such as a wiring substrate at a large area. Thus, heat generated from the semiconductor chip 6 can be immediately released to the outside. In the second embodiment, as illustrated in FIG. 5, the die pad 8 and the inner lead 2f are connected to each other through the suspension lead, but in this embodiment, sufficient heat releasing performance can be obtained even without connection with use of the suspension lead.

FIGS. 8A to 8D are plan views illustrating the shapes of the through hole of the present invention.

Figure 8A:
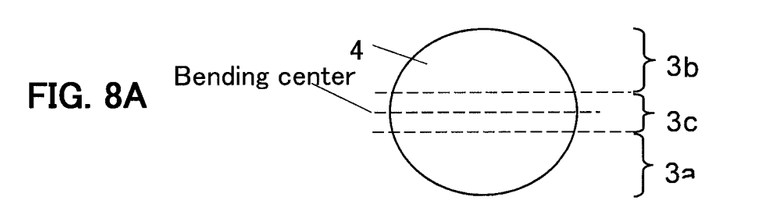
FIGS. 8A to 8D are plan views illustrating shapes of a through hole of the present invention.
Figure 8B:
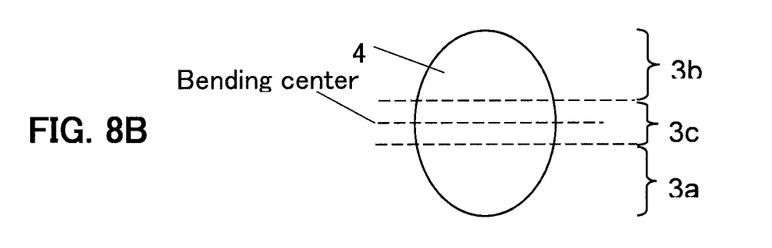
Figure 8C:
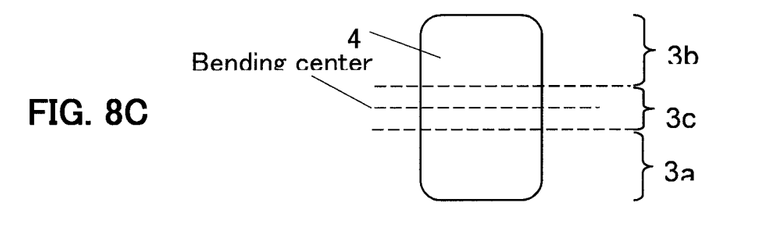
Figure 8D:
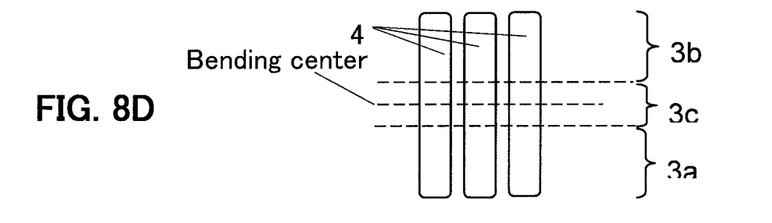

The through hole 4 that is formed continuously through the horizontal portion 3a, the bent portion 3c, and the perpendicular portion 3b can have various shapes. FIG. 8A illustrates a circular shape, FIG. 8B illustrates an elliptical shape, FIG. 8C illustrates a rounded rectangular shape, and FIG. 8D illustrates a plurality of slits. The perpendicular portion 3b is bent by 90° with respect to the horizontal portion 3a with the center of the through hole as the bending center, but the bent portion 3c is provided between the perpendicular portion 3b and the horizontal portion 3a, and hence the continuous through hole 4 is also provided therein.

Figure 9A:
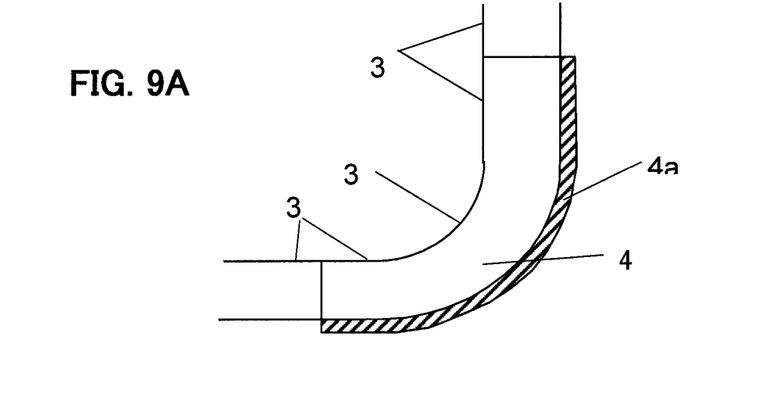
FIGS. 9A and 9B are views illustrating a peripheral edge shape of the through hole of the present invention.
Figure 9B:
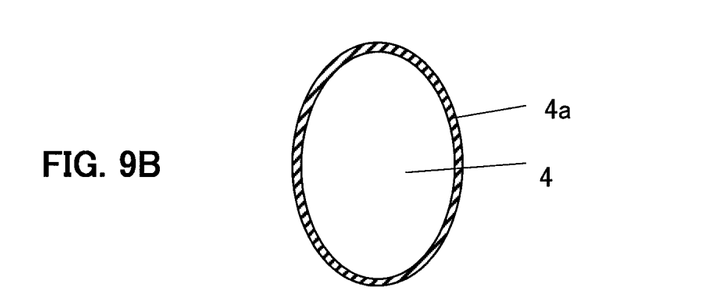

FIGS. 9A and 9B are views illustrating a peripheral edge shape of the through hole of the present invention. FIG. 9A is a sectional view, and FIG. 9B is a plan view.

At the peripheral edge of one side of the through hole 4, a protrusion 4a is formed of the same material as the lead, which provides an effect of bringing the lead frame into closer contact with the resin molded member. The through hole 4 can be formed by punching, laser melting, and the like. The protrusion 4a of different sizes and shapes is formed from the punching burr or melting residue. A satisfactory close-contact and fitting performance to the resin molded member can be obtained due to the existence of the protrusion 4a of different sizes and shapes.

A highly reliable semiconductor device can thus be provided, and hence the semiconductor device may contribute to supply for not only televisions, home appliances, and mobile phones, but also semiconductor device mounting apparatus considering even use in on-vehicle or outdoor applications whose environment is more severe.

What is claimed is:

1. A semiconductor device, comprising:
   a semiconductor chip;
   a resin molded member comprising:
      a hollow portion having an inner bottom surface on which the semiconductor chip is mounted;
      a surrounding portion formed so as to surround the hollow portion; and
      a bottom surface portion formed below the surrounding portion and the hollow portion;
   an inner lead having a region exposed to the hollow portion and a region buried in the resin molded member, the inner lead having an L-shaped lead extending portion comprising a horizontal portion, a bent portion, and a perpendicular portion; and
   an outer lead that is continuous to the inner lead and is exposed from the resin molded member,
   wherein the L-shaped lead extending portion has a through hole formed therethrough.

2. A semiconductor device according to claim 1, wherein the through hole is formed continuously through the horizontal portion, the bent portion, and the perpendicular portion of the L-shaped lead extending portion.

3. A semiconductor device according to claim 2, wherein the through hole has a peripheral edge comprising a protrusion.

4. A semiconductor device according to claim 1,
   wherein the through hole comprises a plurality of holes, and
   wherein all of the plurality of holes are formed continuously through the horizontal portion, the bent portion, and the perpendicular portion of the L-shaped lead extending portion.

5. A semiconductor device according claim 1, further comprising a die pad that is made of the same material as the inner lead, and is buried in the bottom surface portion of the resin molded member in such a manner that a surface of the die pad is exposed,
   wherein the semiconductor chip is fixed onto the die pad.

6. A semiconductor device according to claim 5,
   wherein the die pad has a die pad through hole formed at a center of the die pad, and
   wherein the die pad through hole is filled with a resin of the resin molded member.

7. A semiconductor device according to claim 5, wherein the die pad has a back surface opposite to a surface on which the semiconductor chip is placed, the back surface being exposed from the resin molded member.

* * * * *